United States Patent [19]

Allen

[11] Patent Number: 5,187,392

[45] Date of Patent: Feb. 16, 1993

[54] PROGRAMMABLE LOGIC DEVICE WITH LIMITED SIGNAL SWING

[75] Inventor: Michael J. Allen, Rescue, Calif.

[73] Assignee: Intel Corporation, Santa Clara, Calif.

[21] Appl. No.: 738,783

[22] Filed: Jul. 31, 1991

[51] Int. Cl.[5] .................... H03K 19/173; H03K 5/00
[52] U.S. Cl. ................................ 307/465; 307/468; 307/530; 307/548
[58] Field of Search .............. 307/530, 465, 468, 546, 307/547, 548, 549, 550, 553, 554

[56] References Cited

U.S. PATENT DOCUMENTS

| | | | |
|---|---|---|---|
| 4,617,479 | 10/1986 | Hartmann et al. | 307/468 |
| 4,730,275 | 3/1988 | Baskett | 307/449 |
| 4,785,423 | 11/1988 | Skupnjak et al. | 365/189 |
| 4,833,646 | 5/1989 | Turner | 307/468 |
| 4,899,070 | 2/1990 | Ou et al. | 307/468 |
| 4,967,395 | 10/1990 | Watanabe | 365/189.06 |

Primary Examiner—Edward P. Westin
Assistant Examiner—Andrew Sanders
Attorney, Agent, or Firm—Blakely, Sokoloff, Taylor & Zafman

[57] ABSTRACT

A programmable logic device is described. The programmable logic device includes a plurality of memory cells, each having a drain, a source, a floating gate, and a control gate. A first bit line is coupled the drain of each of the plurality memory cells. The bit line provides a voltage level. A second bit line is coupled to the source of each of the plurality of memory cells. The programmable logic device further includes means for controlling the voltage level to swing between a first voltage state and a second voltage state. The controlling means receives current from the first bit line to clamp the voltage level to the first voltage state when the voltage level exceeds the first voltage state. The controlling means provides current to the first bit line and limits current flow of the first bit line to maintain the voltage level to the second voltage state when the voltage level exceeds below the second voltage state.

8 Claims, 2 Drawing Sheets

FIG_1 (PRIOR ART)
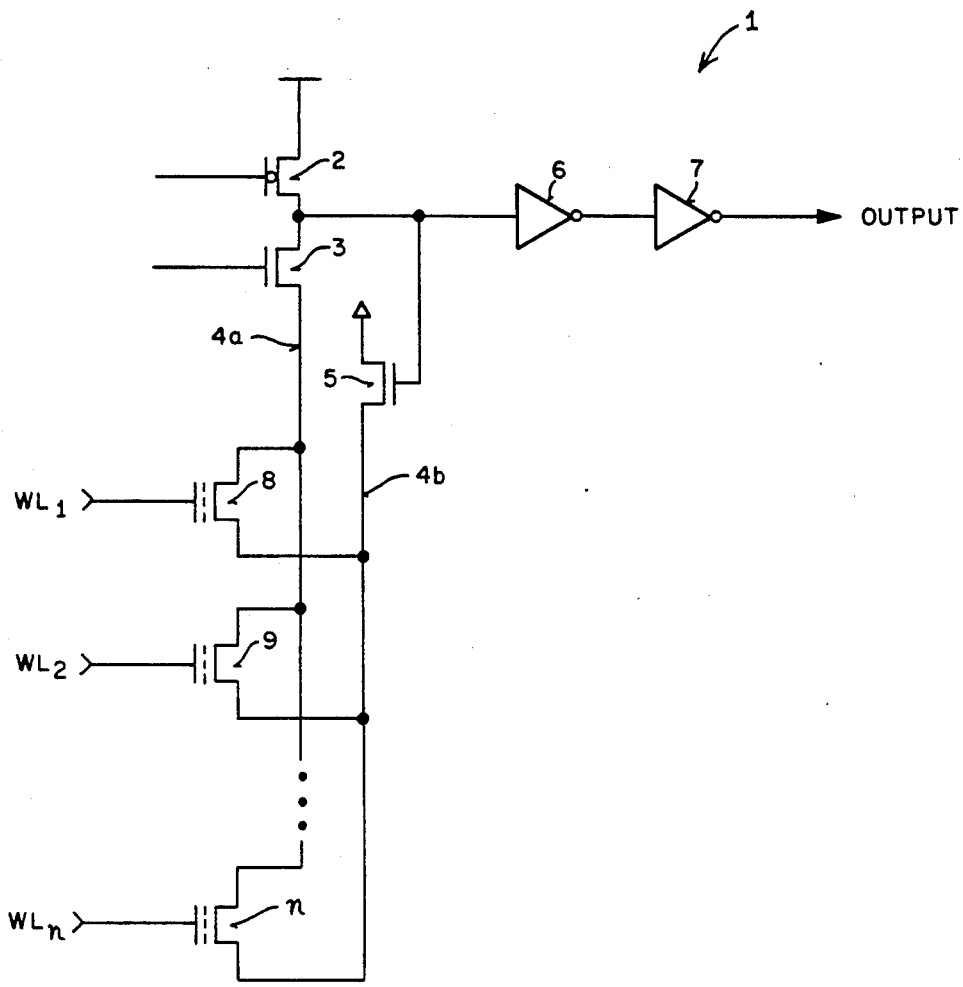
FIG_2
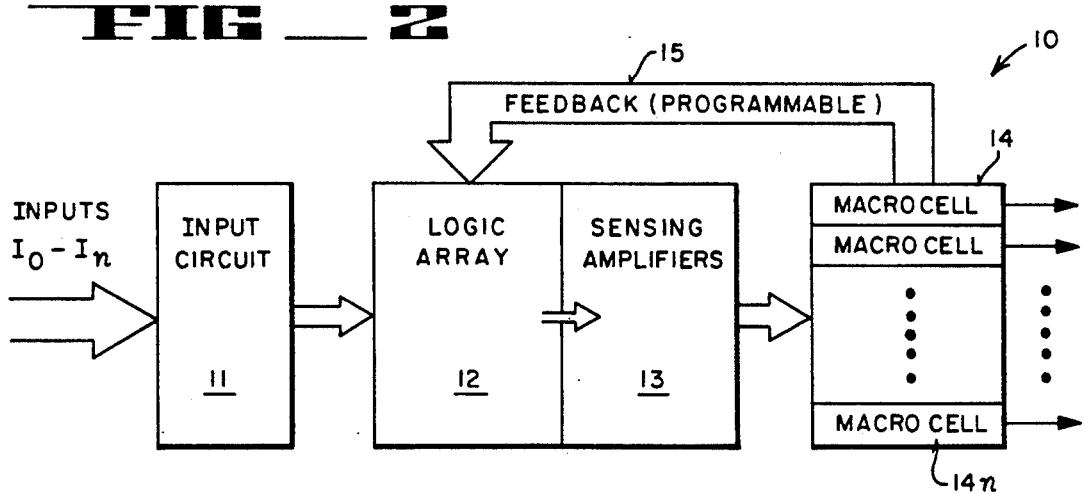

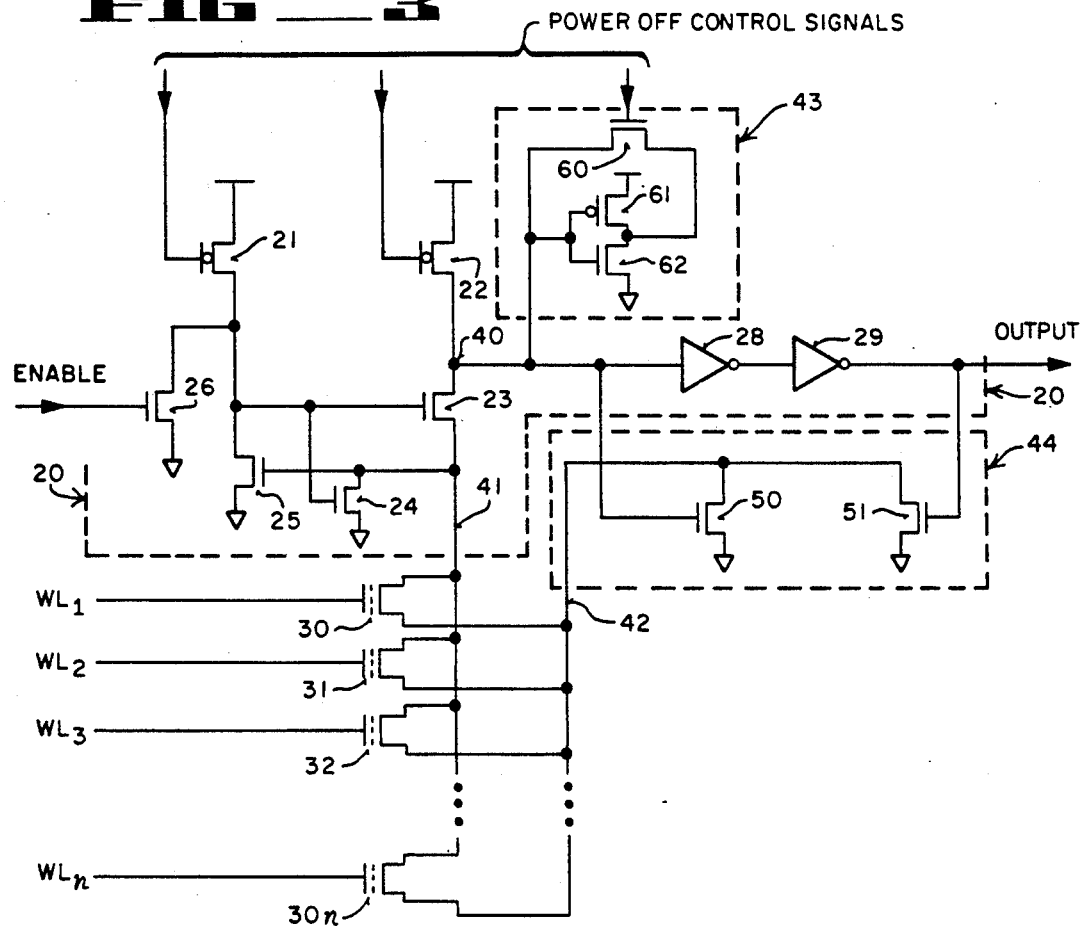
FIG_3
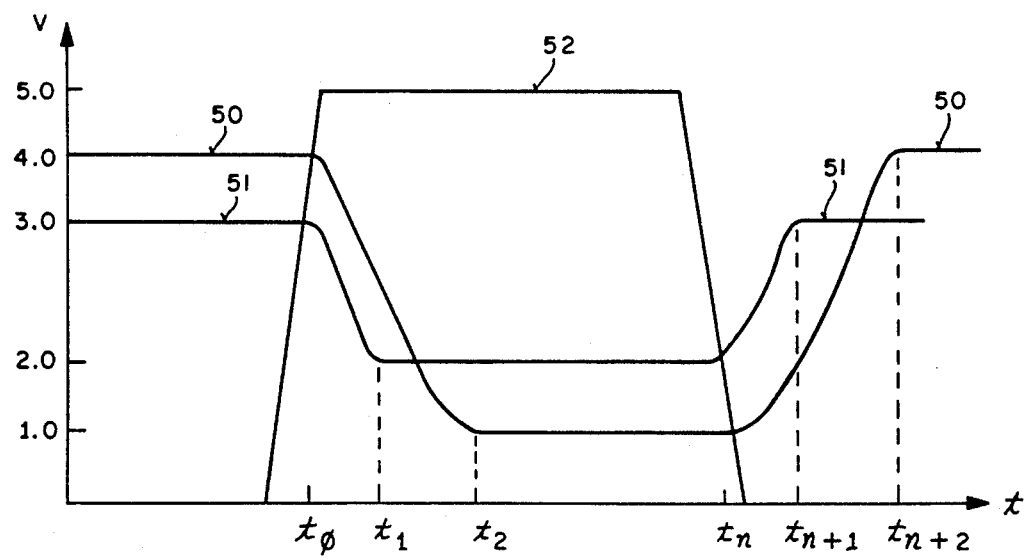
FIG_4 (PRIOR ART)

PROGRAMMABLE LOGIC DEVICE WITH LIMITED SIGNAL SWING

FIELD OF THE INVENTION

The present invention pertains to the field of programmable logic devices. More particularly, this invention relates to a programmable logic device with limited signal swing.

BACKGROUND OF THE INVENTION

Erasable programmable read-only memories ("EPROMs") have been known and used in many areas. One prior use of the EPROMs is in programmable logic devices ("PLDs"). A prior PLD typically includes a programmable logic array that may be comprised of a plurality of EPROM cells. In this instance, PLDs are also erasable and can be referred to as erasable programmable logic devices ("EPLDs").

Typically, the logic array includes a plurality of row lines (i.e., word lines) and a plurality of column lines (i.e., bit lines). The PLD also includes a plurality of device inputs, each of which is divided into an inverting input and a non-inverting input and therefore is coupled to a pair of word lines of the logic array. Each column of the memory cells are coupled together to one of the bit lines. The bit lines of the logic array provide outputs of the logic array. These bit line outputs are then sensed by sensing amplifiers to determine the logical values, each of the sensing amplifiers is coupled to each of the bit lines. The product outputs from the sensing amplifiers are then OR'ed to provide a sum of the products.

As discussed above, each of the device inputs of the PLD is divided into an inverting word line input and a non-inverting word line input that are coupled to a pair of the word lines of the logic array. Therefore, at any given time as many as half of the EPROM cells on a bit line may be conducting if all EPROM cells along the bit line are unprogrammed. The speed performance of the PLD is determined by the time required for a plurality of EPROM cells in the logic array to change from a conducting state to a non-conducting state, or vice versa. The transition phase is dependent upon the number of unprogrammed (i.e., erased) EPROM cells selected in a certain column of the array. For example, when a particular memory cell is conducting, the conducting cell effectively places a low voltage on its bit line, whereby a given value of current is drawn through that particular cell. Assuming that each cell draws approximately the same value of current, the amount of current drawn on the bit line will be equivalent to the conduction current of the given cell multiplied by the number of cells that are conducting.

One disadvantage of the prior PLD is that when multiple cells are conducting, a higher current flow occurs on the bit line which results in a higher voltage swing between the "on" state (i.e., logical low output at the bit line and the "off" state (i.e., logical high output at the bit line). The increased voltage swing results in a longer period of time required for the bit line to stabilize to its "on" and "off" states, which ultimately affects the speed performance of the PLD.

One prior solution to solving the problem is shown in FIG. 1. In FIG. 1, a column of memory cells 8 through n are shown, each having its drain coupled to a first bit line 4a and its source to a second bit line 4a. The output of the column at the first bit line 4a is coupled to a sensing amplifier formed by inverters 6 and 7. The second bit line 4b is coupled to ground via a current limiting transistor 5. Transistor 5 has its gate coupled to the output of the first bit line to receive a feedback signal for controlling the current on the bit lines 4a and 4b. A detailed description of this prior solution is disclosed in the U.S. Pat. No. 4,785,423 to Skupnjak et al.

One disadvantage associated with the prior solution is that the current limiting transistor 5 only functions to control the discharge of the bit lines to a higher voltage level at the "on" state so as to present a smaller signal voltage swing. The voltage level at the "off" state, however, is not lowered by the current limiting transistor 5 and the signal swing typically remains in a larger range of 3 volts, which still affects the speed performance of the PLD.

Another disadvantage associated with this prior solution is that transistor 5 needs to be very large in order to perform the current limiting function on the bit lines. The large transistor 5 typically occupies more space in the PLD, which then reduces the integration degree of the PLD. It also capacitively loads the circuit and slows the switching speed.

SUMMARY AND OBJECTS OF THE INVENTION

One of the objects of the present invention is to provide circuitry for increasing the speed performance of a PLD.

Another object of the present invention is to provide circuitry for reducing the power consumption of the PLD while increasing the speed performance of the PLD.

Another object of the present invention is to provide circuitry for increasing the speed performance of the PLD while maintaining the high degree of integration of the PLD.

A programmable logic device is described. In one embodiment, the programmable logic device includes a plurality of memory cells, each having a drain, a source, a floating gate, and a control gate. A first bit line is coupled the drain of each of the plurality memory cells. The bit line provides a voltage level. A second bit line is coupled to the source of each of the plurality of memory cells. The programmable logic device further includes means for controlling the voltage level to swing between a first voltage state and a second voltage state. The controlling means receives current from the first bit line to clamp the voltage level to the first voltage state when the voltage level exceeds the first voltage state. The controlling means provides current to the first bit line and limits current flow of the first bit line to maintain the voltage level to the second voltage state when the voltage level exceeds below the second voltage state.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a schematic diagram showing one prior art EPROM column of a PLD array;

FIG. 2 is a block diagram of a PLD;

FIG. 3 is a schematic diagram showing one EPROM column of the PLD array, including a feedback inverting circuit and a split current limiting circuit;

FIG. 4 is a graphic diagram representing a comparison of the responses from the circuits of FIG. 1 and FIG. 3.

DETAILED DESCRIPTION

FIG. 2 illustrates in block diagram form the circuitry of a PLD 10, which implements a preferred embodiment of the present invention. In FIG. 2, a plurality of input lines $I_0$ through $I_n$ are coupled as input to a logic array 12 via an input circuit 11. Standard TTL level input signals are applied to input circuit 11 via lines $I_0$ through $I_n$. Input circuit 11 level shifts the input signals. Input circuit 11 also includes a read row driver (not shown) which receives the level shifted signals and drives logic array 12. Logic array 12 is composed of a plurality of memory cells arranged in a matrixed array.

In one preferred embodiment, logic array 12 is comprised of EPROM cells. In another embodiment, logic array 12 is comprised of flash EPROM cells. In alternative embodiments, logic array 12 may be comprised of other type of memory cells, such as PROM cells.

In one preferred embodiment, PLD 10 employs CHMOS circuitry. In another preferred embodiment, PLD 10 employs CMOS circuitry.

Logic array 12 includes a plurality of word lines. Each of the word lines in logic array 12 is coupled to the control gate of each of the EPROM cells in a row. The inputs $I_0$ through $I_n$ each is coupled to a pair of word lines via input circuit 11. One of each pair of word lines receives the true input signal of its respective input and the other receives the complement of the input signal.

Logic array 12 also includes a plurality of first bit lines and a plurality of second bit lines. Each of the first bit lines is coupled to the drain of each of the EPROM cells in a column. Each of the second bit lines is coupled to the source of each of the EPROM cells in one column. Each of the second bit lines is then coupled to a current limiting circuit (not shown) which will be described in more detail hereinafter, in conjunction with FIG. 3.

The array configuration of logic array 12, as well as its connection with sensing amplifiers 13, will also be described in more detail below, in conjunction with FIG. 3.

Each of sensing amplifiers 13 is coupled to one of the first bit lines of logic array 12 and senses the output of the first bit line. Sensing amplifiers 13 then each provides an output corresponding to the state of its first bit line coupled. The outputs of sensing amplifiers 13 are typically coupled to macrocells 14 through 14n of PLD 10.

Each of macrocells 14 through 14n is responsive to predetermined number of product terms (i.e., p-terms) which are normally OR'ed together to provide a sum of the product terms. The outputs from macrocells 14 through 14n are then coupled externally to PLD 10 via an input/output ("I/O") circuit (not shown). The I/O circuit provides either a combinational logic or a sequential logic circuit.

The outputs of macrocells 14 through 14n are also coupled back to logic array 12 via feedback 15 for the purpose of providing feedback inputs to logic array 12. Feedback 15 is a programmable feedback.

In operation, each of the EPROM cells in logic array 12 functions equivalent to a EPROM cell in other devices. When any of the EPROM cells in logic array 12 are programmed, the EPROM cell ceases conduction, regardless of a signal present on its control gate. However, when a particular cell is unprogrammed (erased), the conduction of that cell depends on the signal present on its respective word line. A five volt input signal on a particular word line will turn on the unprogrammed cells along the word line and permit current conduction between the drain and the source of the unprogrammed cells. Therefore, logic array 12 may have anywhere from zero to 50% of the total cells conducting at any given time.

As described above, sensing amplifiers 13 are coupled to the first bit lines of logic array 12. Sensing amplifiers 13 sense the voltage state of the first bit lines. If all of EPROM cells along a particular first bit line are in the programmed state, none of the cells will be conducting even when a five volt high voltage is applied to their respective word lines. The first bit line then registers a high voltage state and sensing amplifiers 13 detect a logical high output for this particular first bit line. However, if any of the cells along the particular first bit line is in the erased state, the cell can be conducting when a five volt signal is applied to its respective word line. The first bit line then registers a low voltage state and sensing amplifiers 13 detect a logical low output for the first bit line. The voltage level on the first bit line swings from the high voltage state to the low voltage state when at least one of the cells coupled to the first bit line is conducting.

The range between the high voltage and the low voltage represents the voltage swing on bit line 41. Large voltage swing reduces the speed performance of PLD 10 while small voltage swing increases the speed performance of PLD 10.

In the presently preferred embodiment, the voltage swing between the high voltage state and the low voltage state is approximately 1 volt. the high voltage state is at about 3 volts while the low voltage state is at about 2 volts. The switching threshold for sensing amplifiers 13 is at about 2.5 volts.

To achieve the reduced signal voltage swing on the first bit lines, a current limiting circuit and a feedback inverting circuit (not shown) are incorporated into logic array 12 and sensing amplifiers 13. The feedback inverting circuit reduces the signal voltage swing by clamping the voltage level of the high voltage state and the low voltage state close to the switching threshold of sensing amplifiers 13, wherein the speed performance of PLD 10 is improved. The current limiting circuit functions to limit the current flow on the bit lines, wherein the voltage level of the low voltage state is raised close to the switching threshold of sensing amplifiers 13. The current limiting circuit also reduces power consumption of PLD 10 with the reduced signal voltage swing. The circuit and operation of the current limiting circuit and the feedback inverting circuit will be described in more detail below, in conjunction with FIG. 3.

FIG. 3 illustrates a portion of logic array 12 coupled to one of sensing amplifiers 13. In FIG. 3, a column of EPROM cells 30 through 30n have their drains coupled to a first bit line 41, and their source coupled to a second bit line 42. The control gates of EPROM cells 30 through 30n each is coupled to one of word lines WL1 through WLn. For example, cell 30 has its gate coupled to word line WL1. The first bit line 41 is coupled to sensing amplifier circuit 20. The second bit line 42 is coupled to a current limiting circuit 44. Current limiting circuit 44 is also coupled to sensing amplifier circuit 20.

Sensing amplifier circuit 20 is employed to sense the voltage state of the first bit line 41. Circuit 20 is coupled to an input transition detect circuitry, which detects an input change and provides an enable signal ENABLE to sensing amplifier circuit 20. Sensing amplifier circuit 20 includes transistors 21 through 26 and inverters 28 and 29. The first bit line 41 is coupled to the source of transistor 22 and inverter 28 at node 40. The drain of transistor 22 is coupled to the Vcc power supply. The gate of transistor 23 is coupled to the gate of transistor 24 and the drain of transistor 25. The drain of transistor 25 is coupled to the Vcc power supply via transistor 21. Transistor 26 has its gate coupled to receive the ENABLE signal and its drain coupled to the drain of transistor 25. The gates of transistors 21 and 22 are coupled to receive power control signals, respectively. When transistors 21 and 22 are turned on, sensing amplifier circuit 20 is powered up. When transistors 21 and 22 are off, sensing amplifier circuit 20 is powered down.

The ENABLE signal coupled to the gate of transistor 26 controls the enabling of sensing amplifier circuit 20. When transistor 26 is turned off by the ENABLE signal, sensing amplifier circuit 20 is enabled to activate bit line 41. When transistor 26 is turned on by the ENABLE signal, sensing amplifier circuit 20 is disabled.

In one preferred embodiment, transistors 21 and 22 are weak depletion N-channel transistors and transistors 23 through 26 are N-channel transistors. In alternative embodiments, P-channel transistors may be employed to replace transistors 21 and 22.

Inverters 28 and 29 are employed to sense the reading of the first bit line 41. Inverter 28 is coupled to the first bit line 41 at node 40 via transistor 23. Inverter 29 provides the output of sensing amplifier circuit 20. The output of sensing amplifier circuit 20 is coupled to circuitry external to sensing amplifier circuit 20, which can be a variety of circuits for processing the signal from the first bit line 41.

Sensing amplifier circuit 20 further includes a feedback inverter 43. Inverter 43 has its input and output both coupled to bit line 41 at node 40. Inverter 43 includes a CMOS circuit formed by P-channel transistor 61 and N-channel transistor 62. The output of inverter 43 is fed back to the input of inverter 43 via transistor 60. Transistor 60 has its gate coupled to receive the power control signals. When transistor 60 is turned off by the power control signals, the feedback of inverter 43 is disabled. When transistor 60 is turned on by the power control signals, the feedback of inverter 43 is enabled.

Inverter 43 is employed to clamp the voltage swing on the first bit line 41 to a reduced range. As described above, the voltage swing in the presently preferred embodiment is 1 volt with the high voltage state being. 3 volts and the low voltage state being 2 volts. The switching threshold of inverters 28 and 29 is 2.5 volts. Also, the switching threshold of inverter 43 is 2.5 volts. Inverter 43 functions to supply current to bit line 41 to pull up the voltage level of bit line 41 close to the switching threshold voltage of inverters 28 and 43 when bit line 41 registers the low voltage state. Inverter 43 absorbs current from bit line 41 to limit the voltage level of bit line 41 close to the switching threshold voltage of inverters 28 and 43 when bit line 41 registers the high voltage state. The clamping function of inverter 43 will be described in more detail below.

As discussed above, the second bit line 42 is coupled to current limiting circuit 44. Current limiting circuit 44 includes transistors 50 and 51. Transistor 50 has its drain coupled to the second bit line 42, its source coupled to ground, and its gate coupled to node 40. Transistor 51 has its drain coupled to the second bit line 42, its source coupled to ground, and its gate to the output of sensing amplifier circuit 20.

Current limiting circuit 44 functions to limit current flow of bit lines 41 and 42 when multiple cells among cells 30 through 30n are conducting. Transistors 50 and 51 operate as a current controller to control the current drawn through bit lines 41 and 42. Minimum current flow occurs when only one of cells 30 through 30n is in the erased state and conducting. Maximum current flow occurs when all cells 30 through 30n are erased and are selected. As more cells of cells 30 through 30n commence to conduct, more current is drawn on bit lines 41 and 42. The voltage level on bit line 41 further decreases, which results in the reduction of the gate drive of transistor 50. As the gate drive of transistor 50 is reduced, less current is allowed to pass through transistor 50, whereby limiting the current which is drawn through bit line 41 and 42 and raising the voltage level of bit line 41. Transistor 51 is completely turned off when voltage level at node 40 decreases far below the switching threshold of sensing amplifier circuit 20. The current limiting function of current limiting circuit 44 helps to raise the voltage level of bit line 41 close to the switching threshold of inverter 28 at node 40 when bit line 41 registers the low voltage state.

In operation, when sensing amplifier circuit 20 is enabled by the ENABLE signal at transistor 26, transistors 22 and 23 conduct to read the voltage state of bit line 41 (Assume transistors 21 and 22 are maintained on during this operation). When sensing amplifier circuit 20 is turned on, a sensing of bit line 41 takes place. If none of the EPROM cells 30 through 30n is conducting, bit line 41 then registers the high voltage state. However, if any of the EPROM cells 30 through 30n is conducting, bit line 41 then registers the low voltage state.

The voltage level of both the high voltage state and the low voltage state registered on bit line 41 depends on the amount of current flow through bit line 41. When none of the cells 30 through 30n is conducting, no current passes through bit line 41 to bit line 42 and node 40 will register a high voltage close to the Vcc voltage if inverter 43 is not coupled to node 40. Given that inverter 43 is coupled to node 40 in the presently preferred embodiment, inverter 43 has its transistor 62 on which sinks current from node 40. This brings down the voltage level of bit line 41 at node 40. When the voltage level at node 40 decreases and approaches to the switching threshold of inverter 43, the negative feedback of inverter 43 prevents the voltage level at node 40 from falling down further and maintains the high voltage state of bit line 41 at node 40 at about 3 volts.

When one or more of the EPROM cells 30 through 30n are in erased state and are selected by their respective word lines, the voltage level of bit line 41 at node 40 decreases from the high voltage state to the low voltage state. When the voltage level at node 40 passes the switching threshold of inverters 28 and 43, they start to switch and inverter 29 outputs a logical low signal. At this time, inverter 43 starts to supply current to bit line 41 in order to raise the voltage level of the low voltage state of bit line 41 at node 40 close to the switching threshold of inverter 28. When the voltage level of the low voltage state registered on bit line 41 further decreases inverter 43 supplies more current to bit line 41 to pull up the voltage level of the low voltage state.

Meanwhile, transistor 51 of current limiting circuit 44 is turned off and transistor 50 of current limiting circuit 44 is in weak conduction when bit line 41 registers the low voltage state, limiting current flow of bit line 41. As the gate of transistor 50 is controlled by the voltage level at node 40, the gate drive of transistor 50 is reduced accordingly when the voltage level at node 40 decreases, therefore limiting the current flow on bit line 41 which then results in a rising of voltage level at node 40. When the voltage level at node 40 increases with respect to the current supply of inverter 43 and current limitation of current limiting circuit 44, transistor 50 receives an increased gate drive voltage from node 40 and becomes stronger conducting, which then makes the voltage level decreases to maintain the balance. When the voltage level of bit line 41 further decreases, the gate drive of transistor 50 further decreases which then gradually shuts off transistor 50 to raise the voltage level of bit line 41. Thus, the voltage level of the low voltage state on bit line 41 is maintained at about 2 volts by inverter 43 and current limiting circuit 44.

With current limiting circuit 44, the power consumption of PLD 10 (FIG. 2) is also reduced by limiting the current flow on bit lines 41 and 42. The reduced voltage swing of 1 volt (i.e., between the high voltage state of 3 volts and the low voltage state of 2 volts) also provides a 0.5 volt margin of noise immunity.

FIG. 4 illustrates a comparison of the speed performance of prior circuit of FIG. 1 to the configuration of the presently preferred embodiment as shown in FIG. 3. In FIG. 4, curve 52 represents the signal applied to the word lines WL1 through WLn of FIGS. 1 and 3. Curve 50 represents the signal voltage swing of the prior circuit of FIG. 1. curve 51 represents the signal voltage swing of the configuration of the presently preferred embodiment as shown in FIG. 3.

As can be seen from FIG. 4, when the input signal at word lines WL1 through WLn change to ground which turns off all the cells 8 through n of FIG. 1 and 30 through 30n of FIG. 3, bit line 4a registers a 4 volts high voltage and bit line 41 registers a 3 volt high voltage. Due to the presence of inverter 43 in FIG. 3, bit line 41 registers a lower high voltage of 3 volts (curve 51). Bit line 4a of FIG. 1, however, registers a higher high voltage of 4 volts. At time $t_0$, the input signal starts to rise to Vcc which turns on one or more of the EPROM cells 8 through n (FIG. 1) and 30 through 30n (FIG. 3). The voltage levels on bit line 4a (FIG. 1) and bit line 41 (FIG. 3) start to fall to their low voltage states. At time $t_1$, curve 51 reaches its stabilized low voltage state of 2 volts (curve 51). Curve 50, however, reaches its stabilized low voltage state of 1 volt at $t_2$ (curve 50). Curve 51 reaches its stabilized low voltage state in less time due to the shorter voltage swing from the lower high voltage of 3 volts at $t_0$ to the higher low voltage of 2 volts at $t_1$. This higher low voltage of curve 51 is due to the presence of inverter 43 and current limiting circuit 44.

At time $t_n$, the inputs signal starts to fall to ground which turns off all EPROM cells 8 through n (FIG. 1) and 30 through 30n (FIG. 3). The voltage levels on bit line 4a (FIG. 1) and on bit line 41 (FIG. 3) start to rise.

At time $t_{n+1}$, curve reaches its stabilized high voltage state. Curve 50, however, reaches its stabilized high voltage state at a later time $t_{n+2}$. Again, curve 51 reaches its stabilized high voltage state in less time due to the shorter voltage swing from the higher low voltage of 2 volts at $t_n$ to the lower high voltage of 3 volts at $t_{n+1}$. As described above, bit line 41 registers the lower high voltage as shown by curve 51 of FIG. 4 due to the presence of inverter 43.

Therefore, by clamping the high voltage and the low voltage that bit line 41 registers close to the switching threshold of sensing amplifier circuit 20 and by limiting the current flow on bit line 41, a smaller voltage swing is obtained in the circuit configuration of FIG. 3. The smaller voltage swing reduces the time for bit line 41 to change states, wherein the speed performance of PLD 10 is improved.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A programmable logic device, comprising:
 (a) a first bit line;
 (b) a plurality of memory cells, each having a drain, a source, a floating gate, and a control gate, wherein the drain of each of the plurality of memory cells is coupled to the first bit line;
 (c) a second bit line coupled to the source of each of the plurality of memory cells;
 (d) a sensing amplifier coupled to the first bit line for sensing voltage level of the first bit line;
 (e) current controlling means coupled to the second bit line and the first bit line for limiting current flow on the first bit line, wherein when the voltage level swings from a first voltage state to a second voltage state, the current controlling means limits the current flow on the first bit line to a predetermined current limit; and
 (f) means for clamping the voltage level of the first bit line to swing between the first voltage state and the second voltage state, wherein the clamping means is coupled to the first bit line, wherein when the voltage level approaches the second voltage state, the clamping means provides current to the first bit line, wherein when the voltage level approaches the first voltage state, the clamping means receives current from the first bit line.

2. A programmable logic device, comprising:
 (a) a plurality of memory cells, each having a drain, a source, a floating gate, and a control gate;
 (b) a first bit line, wherein the first bit line is coupled to the drain of each of the plurality of memory cells, wherein the bit line provides a voltage level;
 (c) a second bit line coupled to the source of each of the plurality of memory cells;
 (d) means for controlling the voltage level to swing between a first voltage state and a second voltage state, wherein the controlling means further comprises
  (1) current limiting means for limiting the current flow on the first bit line to a predetermined current limit, and (2) clamping feedback means for (i) receiving current from the first bit line when the voltage level exceeds above the first voltage state and (ii) providing current to the first bit line when the voltage level exceeds below the second voltage state.

3. The device of claim 2, wherein the first voltage state is approximately 3 volts, and the second voltage state is approximately 2 volts.

4. The device of claim 1, wherein the plurality of memory cells are electrically programmable read only memory cells.

5. The device of claim 1, wherein the plurality of memory cells are electrically erasable and programmable read only memory cells.

6. The device of claim 1, wherein the first voltage state is approximately 3 volts, and the second voltage state is approximately 2 volts.

7. The device of claim 1, wherein the clamping means includes a looped inverter, with its input and output both coupled to the first bit line.

8. The device of claim 1, wherein the current controlling means further includes a first transistor and a second transistor, each having a drain, a source, and a gate, wherein the first transistor and the second transistor both have their drain coupled to the second bit line, and their source to ground, wherein the gate of the first transistor is coupled to the first bit line while the gate of the second transistor is coupled to an output of the sensing amplifier.

* * * * *